(12) United States Patent
Basler et al.

(10) Patent No.: US 10,475,909 B2
(45) Date of Patent: Nov. 12, 2019

(54) ELECTRIC ASSEMBLY INCLUDING A BIPOLAR SWITCHING DEVICE AND A WIDE BANDGAP TRANSISTOR

(71) Applicant: Infineon Technologies AG, Neubiberg (DE)

(72) Inventors: Thomas Basler, Riemerling (DE); Roman Baburske, Otterfing (DE); Daniel Domes, Ruethen (DE); Johannes Georg Laven, Taufkirchen (DE); Roland Rupp, Lauf (DE)

(73) Assignee: Infineon Technologies, AG, Neubiberg (DE)

( * ) Notice: Subject to any disclaimer, the term of this patent is extended or adjusted under 35 U.S.C. 154(b) by 0 days.

(21) Appl. No.: 15/608,137

(22) Filed: May 30, 2017

(65) Prior Publication Data
US 2017/0345917 A1 Nov. 30, 2017

(30) Foreign Application Priority Data
May 31, 2016 (DE) .................. 10 2016 110 035

(51) Int. Cl.
*H01L 21/02* (2006.01)
*H01L 29/739* (2006.01)
*H03K 17/04* (2006.01)
*H03K 17/567* (2006.01)

(52) U.S. Cl.
CPC ..... *H01L 29/7393* (2013.01); *H03K 17/0406* (2013.01); *H03K 17/567* (2013.01); *H03K 2217/0036* (2013.01)

(58) Field of Classification Search
USPC ............................. 257/194, 197, 192, 285, 257/E29.246–E29.253, 20, 76; 438/172, 438/167
See application file for complete search history.

(56) References Cited

U.S. PATENT DOCUMENTS

| | | | |
|---|---|---|---|
| 9,083,343 B1* | 7/2015 | Li | H03K 17/063 |
| 2013/0155745 A1* | 6/2013 | Tanaka | H02M 7/003 363/131 |
| 2014/0184303 A1* | 7/2014 | Hasegawa | H03K 17/12 327/377 |
| 2015/0076568 A1* | 3/2015 | Siemieniec | H01L 29/8083 257/263 |
| 2015/0109031 A1 | 4/2015 | Rahimo | |
| 2015/0162407 A1* | 6/2015 | Laven | H01L 29/1095 257/139 |

(Continued)

FOREIGN PATENT DOCUMENTS

EP 2 249 392 11/2010

OTHER PUBLICATIONS

Song, et al. "6.5kV FREEDM-Pair: Ideal High Power Switch Capitalizing on Si and SiC", EPE 2015, ECCE Europe, SBN 9789075815238.*

(Continued)

*Primary Examiner* — Niki H Nguyen
(74) *Attorney, Agent, or Firm* — Dicke, Billig & Czaja, PLLC

(57) ABSTRACT

An electric assembly includes a bipolar switching device and a transistor circuit. The transistor circuit is electrically connected in parallel with the bipolar switching device and includes a normally-on wide bandgap transistor.

22 Claims, 16 Drawing Sheets

(56) References Cited

U.S. PATENT DOCUMENTS

| | | | | |
|---|---|---|---|---|
| 2016/0226479 | A1* | 8/2016 | Xu | H03K 17/56 |
| 2017/0229427 | A1* | 8/2017 | Rahimo | H01L 25/072 |
| 2017/0302152 | A1* | 10/2017 | Watanabe | H02M 1/088 |
| 2017/0302182 | A1* | 10/2017 | Shimizu | H01L 25/07 |
| 2017/0373586 | A1* | 12/2017 | Zhang | H02M 1/088 |

OTHER PUBLICATIONS

Song, et al. "6.5kV FREEDM-Pair: Ideal High Power Switch Capitalizing on Si and SiC", EPE 2015, ECCE Europe, SBN 9789075815238 (Year: 2015).*

X. Song, et al. "6.5kV FREEDM-Pair: Ideal High Power Switch Capitalizing on Si and SiC", EPE 2015, ECCE Europe, ISBN 9789075815238.

Infineon Technologies AG, Sic—JFET, Silicon Carbide JFET, 1200 V CoolSiC Power Transistor IJW120R070T1 Data Sheet; Rev. 2.0, Sep. 11, 2013.

Rahimo, et al.: "Characterization of a Silicon IGBT and Silicon Carbide MOSFET Cross-Switch Hybrid"; IEEE Transactions on Power Electronics, vol. 30, No. 9, Sep. 2015.

Rahimo, et al.: "The Cross Switch "XS" Silicon and Silicon Carbide Hybrid Concept"; PCIM Europe 2015, May 19-21, 2015, Nuernberg, Deutschland, Seiten 382-389, ISBN 978-3-8007-3924-0.

\* cited by examiner

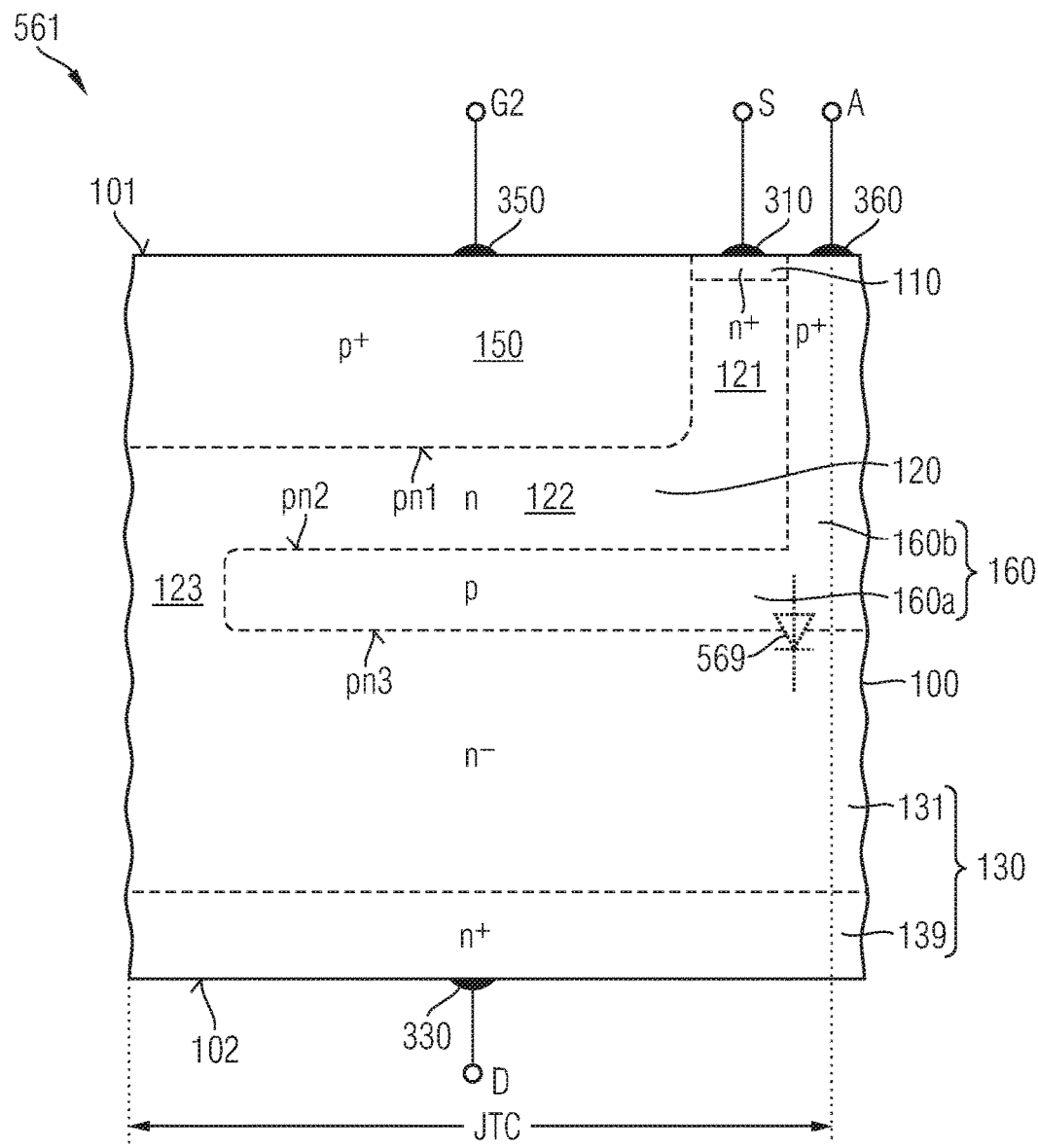

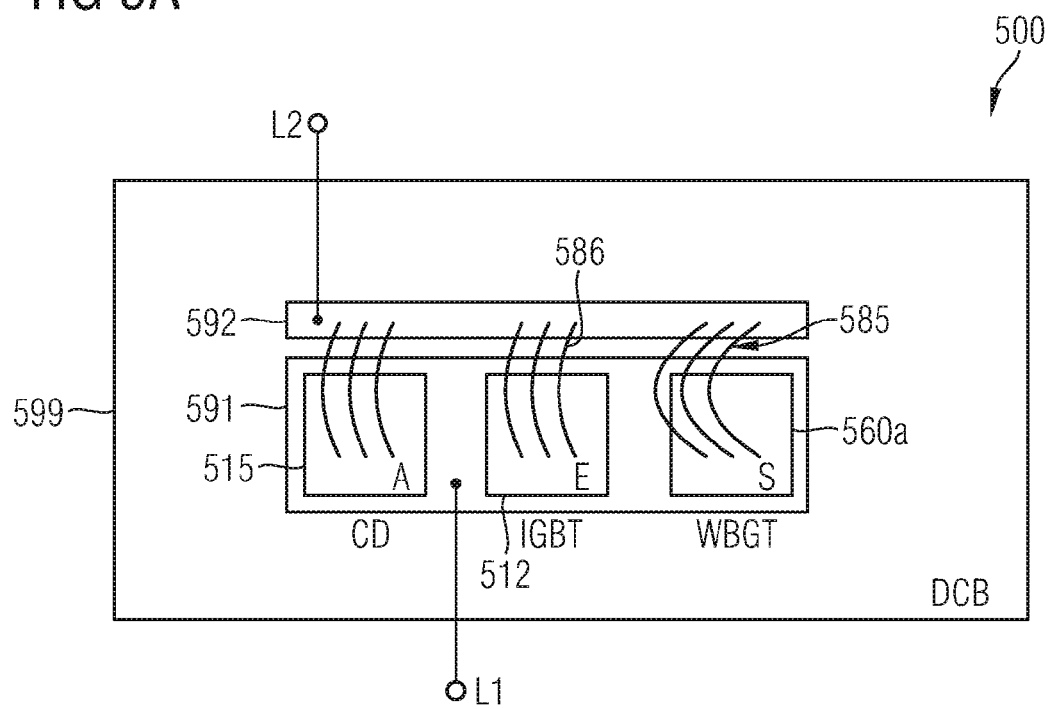
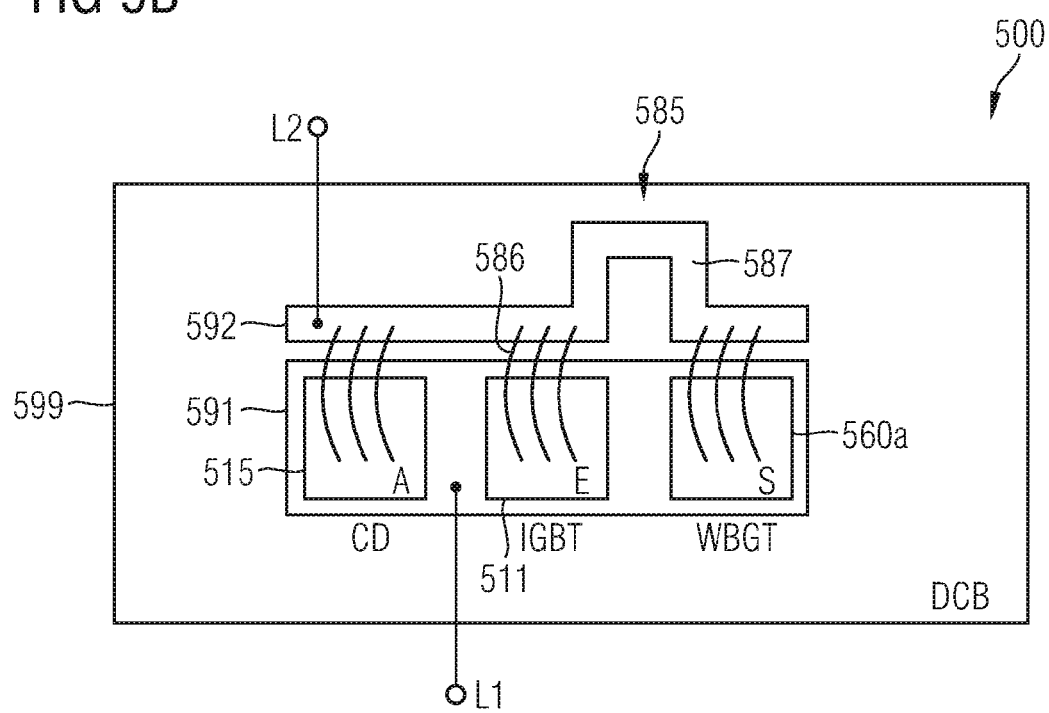

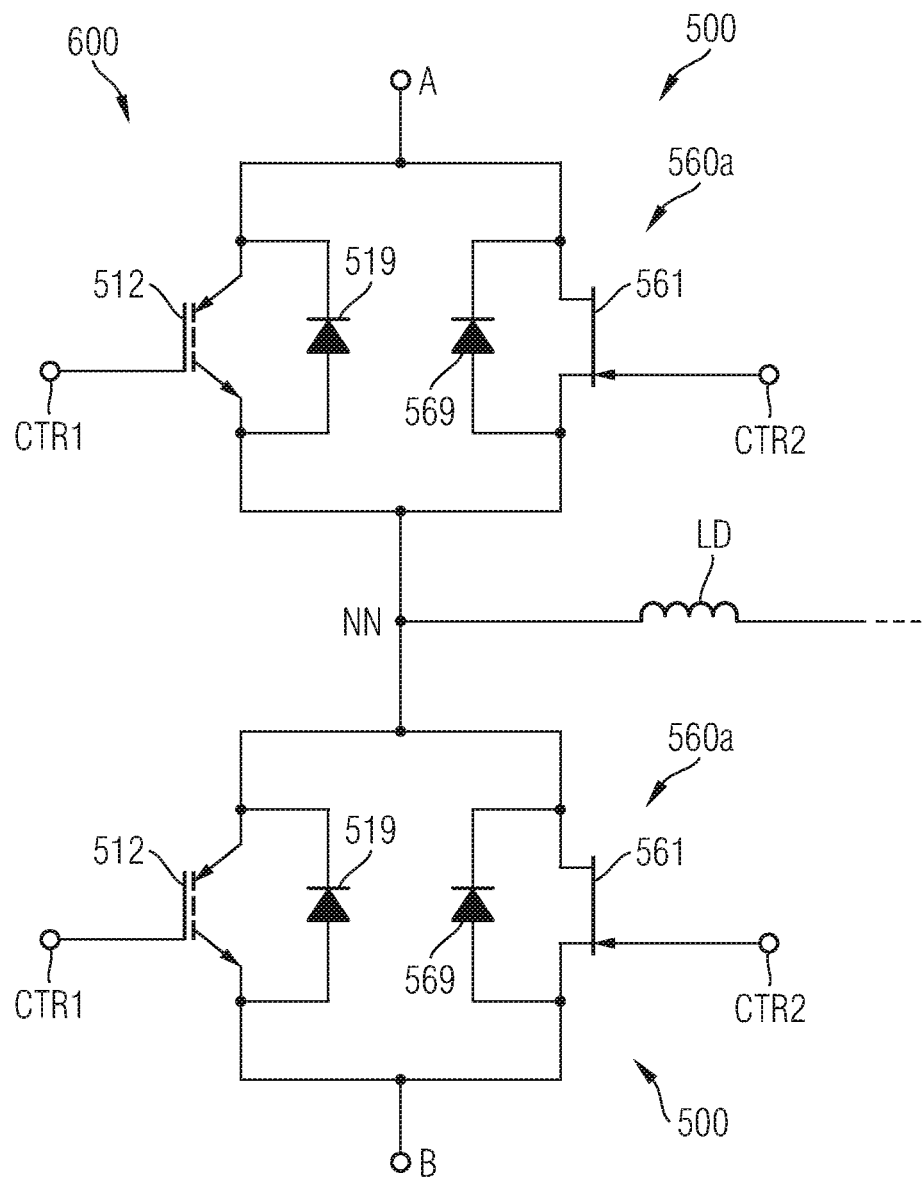

US 10,475,909 B2

1

ELECTRIC ASSEMBLY INCLUDING A BIPOLAR SWITCHING DEVICE AND A WIDE BANDGAP TRANSISTOR

CROSS-REFERENCE TO RELATED APPLICATION

This Utility Patent Application claims priority to German Patent Application No. 10 2016 110 035.8, filed May 31, 2016, which is incorporated herein by reference.

BACKGROUND

IGBTs (insulated gate bipolar transistors), e.g., RC-IGBTs (reverse conducting IGBTs) combine an IGFET (insulated gate field effect transistor) and a bipolar power transistor, wherein the IGFET turns off and on the bipolar power transistor. IGBTs combine the input characteristics of unipolar IGFETs with the high current and low saturation voltage capability of a bipolar power transistor and can be used in high-efficient switched mode power supplies, motor controls, induction heating and other applications. The device characteristics of IGBTs are a trade-off among constraints as regards on-state resistance, reverse recovery charge, avalanche and short-circuit ruggedness, yield and costs.

It is desirable to improve the device characteristics of IGBTs in electric circuits.

SUMMARY

According to an embodiment an electric assembly includes a bipolar switching device and a transistor circuit that is electrically connected in parallel with the bipolar switching device and that includes a normally-on wide bandgap transistor.

According to another embodiment an electric assembly includes a bipolar switching device and a transistor circuit that is electrically connected in parallel with the bipolar switching device and that includes a normally-on junction field effect transistor. The junction field effect transistor includes a semiconductor portion from silicon carbide.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 4A is a schematic vertical cross-sectional view of a portion of an SiC JFET including a horizontal channel region and a shielding region effective as anode region of an integrated body diode according to an embodiment.

FIG. 9A is a schematic plan view of a direct copper bonded board with an electric assembly according to an embodiment including a silicon RC-IGBT, an SiC JFET, and an SiC clamping diode.

FIG. 9B is a schematic plan view of a direct copper bonded board with an electric assembly according to another embodiment with a strip conductor forming a loop between a silicon RC-IGBT and an SiC JFET.

FIG. 10 is a schematic diagram of a half bridge circuit including SiC JFETs electrically connected parallel to silicon RC-IGBTs according to a further embodiment.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
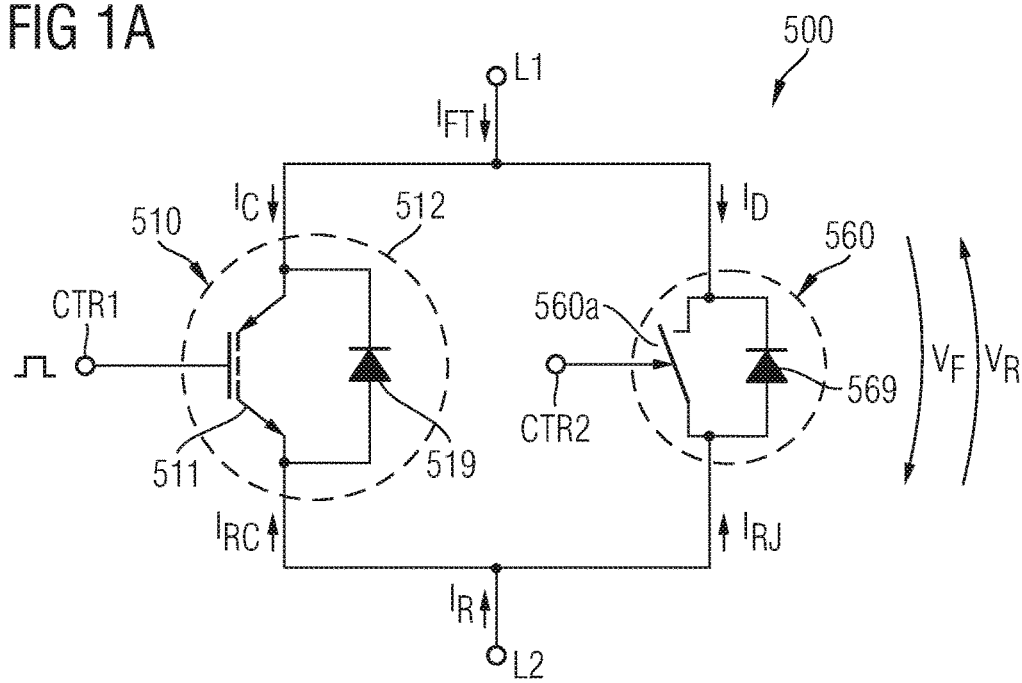
FIG. 1A is a schematic circuit diagram of an electric assembly including a parallel circuit of a bipolar switching device and a transistor circuit including a normally-on WBGT (wide bandgap transistor) according to an embodiment.
Figure 1B:
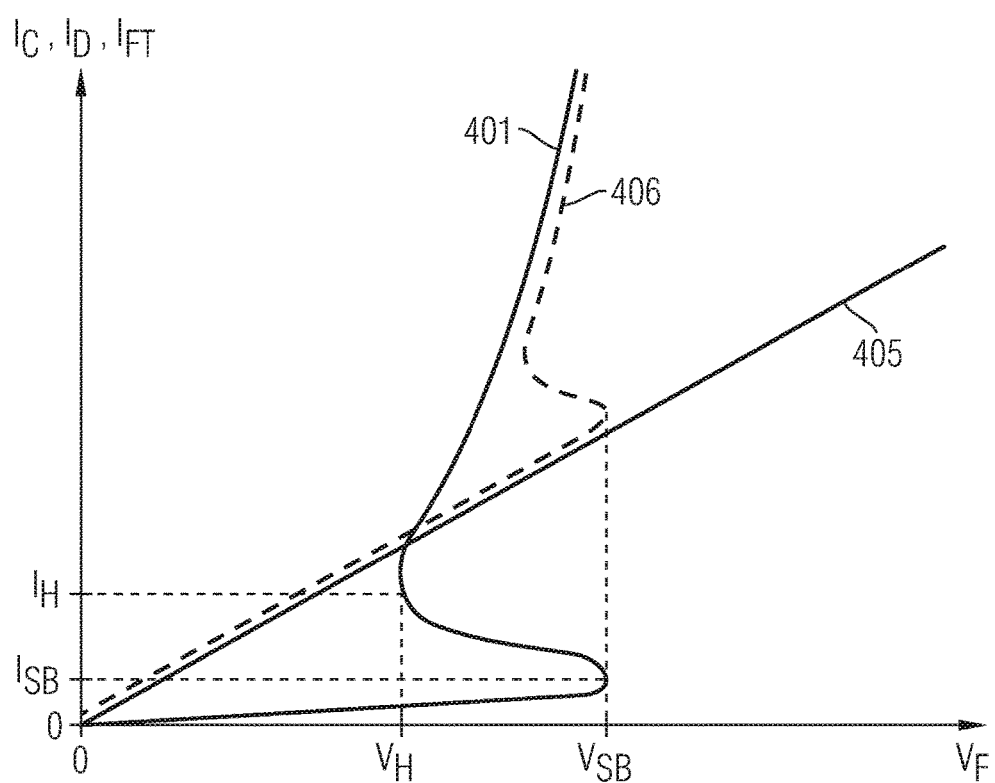
FIG. 1B is a schematic diagram illustrating forward I/V characteristics of the bipolar switching device and the normally-on WBGT of the electric assembly of FIG. 1A according to an embodiment.
Figure 1C:
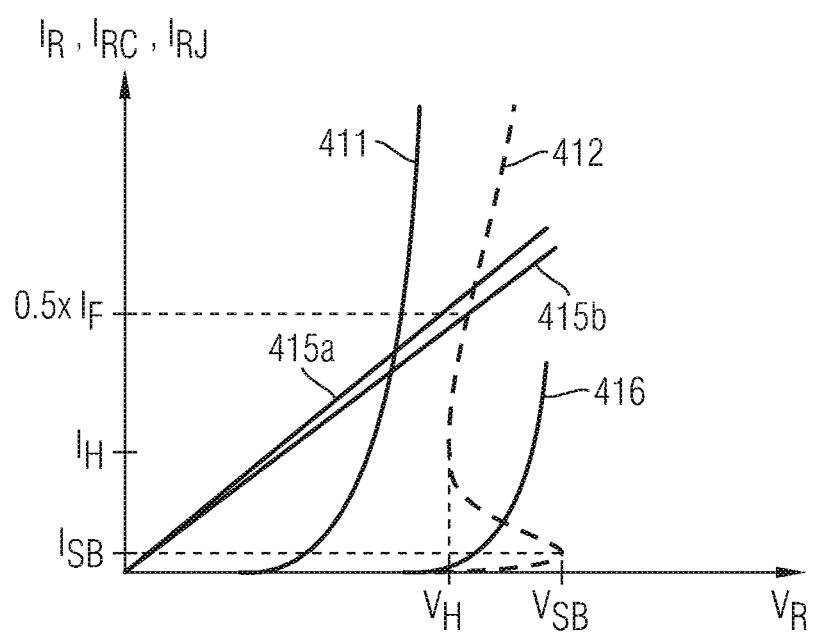
FIG. 1C is a schematic diagram illustrating reverse I/V characteristics of the bipolar switching device and a normally-on WBGT of the electric assembly of FIG. 1A according to an embodiment.

FIGS. 1A to 1C refer to an electric assembly 500 that may form or may be part of a high-side switch or that may form or may be part of a low-side switch of a half-bridge circuit, wherein the half-bridge circuit may be part of a H-bridge, a motor controller or a switched-mode power converter, e.g., a DC/DC power converter, a DC/AC power converter, an AC/AC power converter, or an AC/DC converter. According to other embodiments, the electric assembly 500 may be a multilevel inverter, e.g., a multilevel NPC (neutral point clamped) inverter, or a PFC (power factor correction) converter.

FIG. 1A shows the electric assembly 500 including a bipolar switching device 510, e.g., an IGBT 511 without body diode or an RC-IGBT 512 with integrated body diode 519, wherein the RC-IGBT 512 may include only one type of transistor cells for controlling a load current or may include additional transistor cells selectively or exclusively used for desaturation. A load path of the bipolar switching device 510 is electrically connected between a first and a second load terminal L1, L2 of the electric assembly 500.

A transistor circuit 560 is electrically connected in parallel to the bipolar switching device 510 between the first and second load terminals L1, L2. The transistor circuit 560 includes a normally-on wide bandgap transistor 560a. The normally-on wide bandgap transistor 560a may be a normally-on SiC JFET, a SiC-MOSFET or a GaN HEMT, by way of example.

One of the first and second load terminals L1, L2, for example, the first load terminal L1 is at the supply side and may be electrically coupled to a power supply. The other one of the first and second load terminals L1, L2, for example, the second load terminal L2 is at the load side and may be electrically coupled to a load to which the power supply supplies a load current through the electric assembly 500.

The following description refers to combinations of n-channel reverse blocking IGBTs 511 or RC-IGBTs 512 with n-channel WBGTs. Similar considerations apply for combinations of p-channel reverse blocking IGBTs 511 or RC-IGBTs 512 with p-channel WBGTs.

A first control signal supplied to a gate terminal of the IGBT 511 or RC-IGBT 512 through a first control terminal CTR1 of the electric assembly 500 controls transistor cells of the bipolar switching device 510 by field effect and turns on and off the transistor cells by forming inversion channels through body regions that separate a drain structure from source regions and that form pn junctions with both the drain structure and the source regions of the bipolar switching device 510.

A second control signal, which may be derived from the first control signal applied to the first control terminal CTR1 or which may be generated to some degree independently from the first control signal may be supplied through a second control terminal CTR2 assigned to the transistor circuit 560 to a gate terminal of the WBGT 560a and may turn on or off the WBGT 560a.

FIG. 1B shows the IGBT forward I/V characteristics 401 of the bipolar switching device 510 and the WBGT forward I/V characteristic 405 of the normally-on WBGT 560a. Under forward bias, a positive forward voltage $V_F$ drops between the first and second load terminals L1, L2 of the electric assembly 500 such that the transistor circuit 560 and the bipolar switching device 510 are forward biased and switch a load current between the first load terminal L1 and the second load terminal L2 of the electric assembly 500 in response to the first and second control signals applied to the first and second control terminals CTR1, CTR2.

At a positive gate voltage $V_{GE}$ at CTR1 greater than a threshold voltage, e.g., +15 V, the IGBT 511 or RC-IGBT 512 is on and for $V_F>0$ it carries a collector current $I_C$. The normally-on WBGT 560a is on and forms conduction channels carrying a drain current $I_D$ at any forward voltage $V_F>0V$. At low-current conditions with only a low total forward current $I_{FT}$ through the electric assembly 500, the WBGT 560a takes most of the forward current $I_{FT}$, wherein the voltage drop across the WBGT 560a is smaller than it would be if the IGBT 511 or RC-IGBT 512 were to conduct the same current. By taking over most of the total forward current $I_{FT}$ at a lower forward voltage $V_F$ than a typical silicon pn junction, the normally-on WBGT 560a significantly improves power consumption under open-circuit condition as well as power conversion efficiency under low-load condition, wherein the bipolar switching device 510 may be a reverse blocking IGBT 511 or an RC-IGBT with body diode 519.

On the other hand, at high forward currents $I_R$ the bipolar switching device 510 carries most of the current and the electric assembly 500 benefits from the lower conduction losses compared to that a WBGT would have as a single device at the same current.

The bipolar switching device 510 may show a significant snapback in a range of the collector current $I_C$ through the forward-biased bipolar switching device 510 lower than a snapback hold current $I_H$, wherein at increasing collector current $I_C$ the voltage across the bipolar switching device 510 first rises to a maximum snapback voltage $V_{SB}$ and at further increasing collector current decreases to a snapback hold voltage $V_H$, from which the voltage again increases with further increasing collector current $I_C$.

According to an embodiment, at least up to the snapback current $I_{SB}$, e.g., up to the snapback hold current $I_H$, up to twice or ten times the snap-back hold current $I_H$, the WBGT forward I/V characteristic 405 of the forward biased WBGT is on the left hand side of the IGBT forward I/V characteristic 401 such that at least up to the snapback current $I_{SB}$, to the snapback hold current $I_H$, to twice the snapback hold current $I_H$, or to ten times the snapback hold current $I_H$, the drain current $I_D$ through the transistor circuit 560 is greater than the collector current $I_C$ through the bipolar switching device 510.

Since the transistor circuit 560 carries a greater portion of the total forward current $I_{FT}$ through the electric assembly 500 than the IGBT 511 in the snapback operation range, in the total forward I/V characteristic 406 of the electric assembly 500, the effective amplitude of the snapback is significantly reduced such that adverse effects of the snapback on the circuit environment are attenuated.

Since the snapback behavior of the IGBT 511 or the RC-IGBT 512 comes into effect to a lower degree, the IGBT 511 or RC-IGBT 512 can be designed with a more pronounced snapback, because the transistor circuit 560 partly suppresses the effect of the snapback on the application.

Alternatively or in addition a saturation current $I_{D,sat}$ of the WBGT 560a may be lower than a saturation current $I_{C,sat}$ of the bipolar switching device 510. The WBGT 560a than limits the current through the bipolar switching device 510 under short-circuit conditions. Combined with high short-circuit ruggedness of the WBGT 560a, such current limitation allows the use of bipolar switching devices 510 with lower short circuit ruggedness and smaller active area.

Alternatively, the saturation current $I_{D,sat}$ of the WBGT 560a may be twice or four times higher than a nominal diode forward current $I_F$ of the bipolar switching device 510 such that the bipolar switching device 510 protects the WBGT 560a against short-circuit conditions, wherein the active area of the WGBT 560a may be comparatively small to save costs.

When, starting from an on-state level, the first control signal applied to the first control terminal CTR1 falls below a threshold voltage of the IGBT 511 or RC-IGBT 512, the gated inversion channels of the transistor cells in the bipolar switching device 510 cease to exist and the bipolar switching device 510 blocks. For a threshold voltage $V_{th1}$ of about 4 V, the gate-to-emitter voltage $V_{GE}$ may fall to 0 V or −15 V, by way of example.

When, starting from the on-state level, the second control signal applied to the second control terminal CTR2 falls below a respective threshold voltage $V_{th2}$ of the WBGT 560a, the WBGT 560a also blocks. For a threshold voltage $V_{th2}$ of about −10 V, the gate-to-source voltage $V_{GS}$ may fall to −15 V, or to −20 V, by way of example.

Under reverse bias of the electric assembly 500, the bipolar switching device 510 is reverse biased. A body diode 519 of the RC-IGBT 512 is forward biased and may conduct a reverse current $I_{RC}$ of the RC-IGBT 512. A datasheet of an RC-IGBT 512 typically defines a nominal diode forward current $I_F$ for the reverse current $I_{RC}$ up to which reverse operation of the RC-IGBT 512 is safe. When all transistor cells of the RC-IGBT 512 are off, the reverse current $I_{RC}$ is a bipolar current and corresponds to the diode forward current of the body diode 519. The bipolar current generates a dense charge carrier plasma in a semiconductor portion of the RC-IGBT 512. The denser the charge carrier plasma is the lower is an ohmic resistance $R_{TH}$ of the RC-IGBT 512 under reverse bias.

FIG. 1C shows a saturation I/V characteristic 411 of the reverse biased RC-IGBT 512, wherein the saturation I/V characteristic 411 results from the bipolar current through the body diode 519 in case gated channels of any desaturation transistor cells used for desaturation are turned off. During saturation the gate-to-emitter voltage $V_{GE}$ may be 0 V or −15 V, by way of example.

The desaturation transistor cells may be some of the transistor cells that control the load current through the bipolar switching device 510 under forward bias or may be additional transistor cells that are not used under forward bias.

For temporarily desaturating the RC-IGBT 512 before commutation, the control signal applied to the first control terminal CTR1 turns on the desaturation transistor cells. The gated channels of the desaturation transistor cells start to carry at least a portion of the reverse current $I_R$ through the electric assembly 500. During desaturation the gate-to-emitter voltage $V_{GE}$ may be −15 V or 0 V, by way of example, but is different from the gate-to-emitter voltage $V_{GE}$ for saturation.

In the on state the gated channels of the desaturation transistor cells reduce the voltage drop across at least portions of all or some of the pn junctions of the body diode 519 to below the built-in potential such that the concerned portions of the pn junctions do not longer inject charge carriers. Instead of a fully bipolar current, at least in parts of the semiconductor portion, a unipolar current substitutes the bipolar current in the on-state of the desaturation transistor cells. Since the injection of charge carriers along at least portions of some of the pn junctions of the body diode 519 is suppressed, charge carrier plasma density drops and the electric resistance increases.

The remaining reverse current defines a desaturation I/V characteristic 412 of the reverse biased RC-IGBT 512. Since the charge carrier plasma is less dense with respect to the saturated state, with respect to the saturation I/V characteristic 411, the desaturation I/V characteristic 412 is shifted to higher values of the reverse voltage $V_R$ for the same reverse current IRC through the RC-IGBT 512. The ohmic reverse resistance $R_{rev}$ is significantly greater than for the high bipolar current of the saturated RC-IGBT 512 and results in a higher voltage drop across the RC-IGBT 512 for the same reverse current $I_{RC}$ through the RC-IGBT 512 or in a smaller reverse current $I_{RC}$ at the same reverse voltage $V_R$.

Under reverse bias of the electric assembly 500 the WBGT 560a is reverse biased. For a gate-to-source voltage $V_{GS}$ at the second control terminal CTR2 of the transistor circuit 560 above the threshold voltage $V_{th2}$ of the WBGT 560a, a reverse I/V characteristic of a SiC-JFET used as WBGT 560a may be approximately ohmic in nature. Above a voltage of about −10 V, the SiC-JFET used as WBGT 560a may show a first ohmic reverse I/V characteristic 415a for $V_{GS}$=15 V and a second ohmic I/V characteristic 415b for $V_{GS}$=0 V as schematically illustrated in FIG. 1C. In both cases the conduction channels of the SiC-JFET used as WBGT 560a are not pinched-off.

If the gate-to-source voltage $V_{GS}$ at the second control terminal CTR2 of the transistor circuit 560 pinches off the conduction channels of the SiC-JFET used as WBGT 560a, e.g., at $V_{GS}$=−15 V, the diode I/V characteristic 416 of the body diode 569 of the WBGT 560a determines the mode of operation of the WBGT 560a under reverse bias.

The first and second ohmic I/V characteristics 415a, 415b as well as the diode I/V characteristic 416 are a function of type, layout, dimensions, dopant gradients, and dopant concentrations in the WBGT 560a. The gate-to-source voltage $V_{GS}$ applied to the second control terminal CTR2 can be tailored to the application. The conductivity of the WBGT 560a may be different for saturation and desaturation.

According to an embodiment, a SiC-JFET used as WBGT 560a is not pinched-off during saturation and material, dimensions, layout, dopant concentrations and dopant gradients of the SiC-JFET are tuned such that below the nominal diode forward current $I_F$ of the RC-IGBT 512, the second ohmic I/V characteristic 415b intersects the saturation I/V characteristic 411 of the reverse biased RC-IGBT 512 in a range of the reverse current $I_R$ up to 0.1*$I_F$.

At low-current conditions with only a low reverse current $I_R$ through the electric assembly 500, the WBGT 560a takes most of the total reverse current $I_R$ at a lower reverse voltage $V_R$ than for a typical pn junction such that, for example, power consumption under open-circuit conditions and power conversion efficiency under low-load conditions can significantly be improved.

Alternatively or in addition, during desaturation of the RC-IGBT 512 a control signal applied to the second control terminal CTR2 is selected to not pinch-off the conductive channel in an SiC-JFET used as WBGT 560a such that the I/V characteristic of the WBGT 560a is ohmic in nature, e.g., the first ohmic I/V characteristic 415a or the second ohmic I/V characteristic 415b. The pertinent ohmic I/V characteristic 415a, 415b can be adjusted such that the reverse current $I_{RJ}$ through the transistor circuit 560 is greater than the reverse current $I_{RC}$ through the reverse biased RC-IGBT 512 during desaturation at least for a total reverse current $I_R$ between a lower limit in a range from 0.25*$I_F$ to 0.5*$I_F$ and an upper limit in a range from 0.5*$I_F$ to $I_F$, wherein $I_F$ is the nominal diode forward current up to which the operation of the RC-IGBT 512 is safe, e.g., at least for $I_R$ equal to or greater than $I_F$.

As a consequence, within the complete nominal operating range of the RC-IGBT 512 only few charge carriers are injected into a semiconductor portion of the RC-IBGT 512 during desaturation such that desaturation efficiency is high.

According to an embodiment, type, layout, dimensions, dopant gradients and dopant concentrations of the WBGT 560a are defined such that for reverse currents $I_{RC}$ of the RC-IGBT 512 up to at least once, twice or four times the nominal diode forward current of the RC-IGBT 512, the second ohmic I/V characteristics 415b is on the left hand side of the desaturation I/V characteristic of the RC-IGBT 512. In other words, at least within the nominal operating range the WBGT 560a carries the greater portion of the total reverse current $I_R$ through the electric assembly 500 during desaturation and the reverse current $I_{RJ}$ through the transistor circuit 560 is greater than the reverse current $I_{RC}$ through the reverse-biased RC-IGBT 512.

Typically, in the reverse biased saturation mode of the RC-IGBT 512 all desaturation transistor cells are off such that the exclusively bipolar current ensures high charge carrier plasma density and low ohmic resistance of the RC-IGBT 512. Since the high density charge carrier plasma increases switching losses, conventional desaturable reverse conducting bipolar switching devices, e.g. RCDC (reverse-conducting with diode control)-IGBTs, are desaturated before commutation by switching on the desaturation transistor cells in a desaturation period preceding the commutation that follows the transition from reverse biased to forward biased.

The concerned desaturation transistor cells typically turn off again timely before commutation such that the RC-IGBT 512 safely blocks at the time commutation starts. In this way, critical circuit conditions can be avoided, for example, a short-circuit condition with both the high side and the low side switch of a half-bridge circuit being turned on. During desaturation a unipolar current flows through the desaturation transistor cells and a bipolar current may flow in regions without turned-on desaturation transistor cells to keep the reverse current flowing at sufficiently low reverse voltage $V_R$. As a consequence, charge carriers are also present in the semiconductor portion during desaturation. In a safety period between the end of desaturation and start of commutation a bipolar current again supersedes the unipolar current flow through the desaturation transistor cells, wherein the charge carriers already present in the semiconductor portion have impact on the starting level of the rise of the charge carrier density.

If during desaturation the mode of operation of the WBGT 560a is described by an I/V characteristic at least similar to the second ohmic I/V characteristics 415b of FIG. 1C, a significant portion of the reverse current $I_R$ through the electric assembly 500 may flow as reverse current $I_{RJ}$ through the WBGT 560a and only few charge carriers flow through the RC-IGBT 512 during desaturation.

Since the bipolar switching device 510 is nearly completely turned off, a higher voltage is needed to turn the bipolar switching device 510 on. This in combination with an inductance effective between the RC-IGBT 512 and the WBGT 560a obstructs a fast takeover of the reverse current $I_R$ from the WBGT 560a to the RC-IGBT 512. Charge carrier density in the RC-IGBT 512 remains low in the safety period that follows desaturation such that the electric assembly 500 can combine high desaturation efficiency with high reliability against critical circuit conditions in the application.

Alternatively or in addition, the RC-IGBT 512 is designed with a pronounced snapback in the desaturation mode in a range of a reverse current IRC lower than a snapback current $I_{SB}$, wherein up to the snapback current $I_{SB}$ the second ohmic I/V characteristic 415b is on the left hand side of the desaturation I/V characteristic 412 of the reverse biased RC-IGBT 512 such that at least up to the snapback current $I_{SB}$ the WBGT 560a carries a greater portion of the total reverse current $I_R$ through the electric assembly 500.

Since the WBGT 560a takes most of the current in case the transistor cells TC used for desaturation are on, a snapback behavior of the reverse-biased RC-IGBT 512 during desaturation does not come into effect or is attenuated. The RC-IGBT 512 can be designed with pronounced snapback under reverse bias, because the WBGT 560a suppresses or at least attenuates the effect of the snapback on the application. For example, p- and n-doped regions at the collector side of the RC-IGBT 512 may be optimized for a low ohmic reverse resistance $R_{rev}$ in the reverse conducting mode and a low $Rds_{on}$ in the forward-biased on-state and specific transistor cells designed for attenuating the snapback effect can be omitted.

The WBGT 560a may be designed with a second ohmic I/V characteristic 415b such that the voltage drop across the WBGT 560a is always smaller than a maximum snapback voltage $V_{SB}$ or at least smaller than a snapback hold voltage $V_H$ of the RC-IGBT 512. Alternatively, the WBGT 560a is designed with a second ohmic I/V characteristic 415b such that a reverse current $I_{RJ}$ through the reverse biased transistor circuit 560 is greater than the reverse current $I_{RC}$ through the IGBT 511 or RC-IGBT 512 up to at least once, twice or four times the maximum rating diode forward current $I_F$ of the RC-IGBT 512 to safely avoid any snapback of the RC-IGBT 512.

Alternatively, the WBGT 560a is a SiC-MOSFET or a GaN-HEMT with body diode or a JFET used as WBGT 560a is pinched off during desaturation, such that the reverse I/V characteristic is given by a diode I/V characteristic of a body diode 569. Then the body diode 569 of the WBGT 560a may be designed with a diode I/V characteristic 416 such that the voltage drop across the WBGT 560a is always smaller than a maximum snapback voltage $V_{SB}$ or at least the snapback hold voltage $V_H$ of the RC-IGBT 512. Alternatively, the body diode 569 is designed with a diode I/V characteristic 416 such that a reverse current $I_{RJ}$ through the reverse biased transistor circuit 560 is greater than the reverse current $I_{RC}$ through the IGBT 511 or RC-IGBT 512 up to at least four times the maximum rating diode forward current $I_F$ of the RC-IGBT 512 to safely avoid any snapback of the RC-IGBT 512.

Figure 2A:
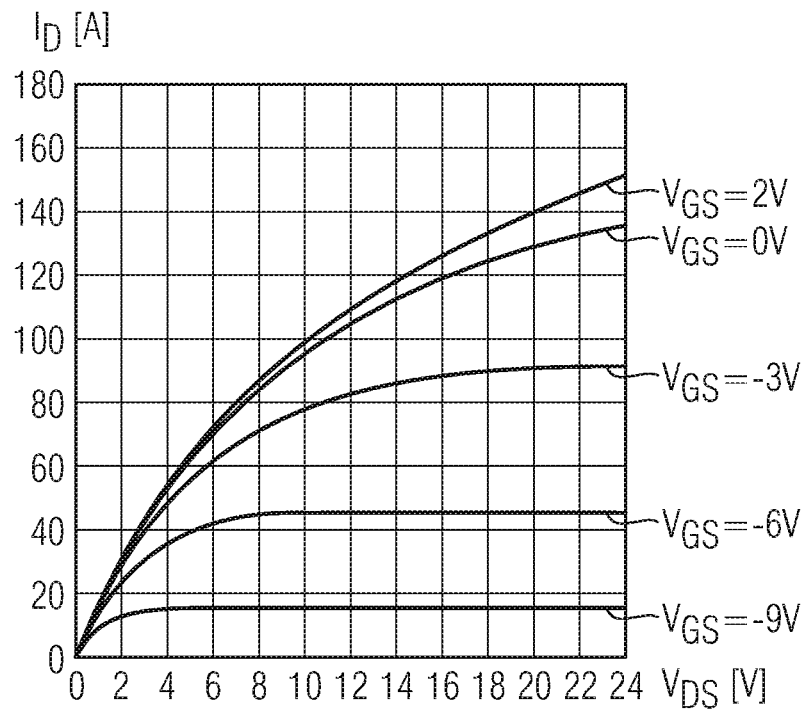
FIG. 2A is a schematic diagram showing forward I/V characteristics of a normally-on JFET at different gate voltages to discuss effects of the embodiments.

FIG. 2A refer to the forward I/V characteristic of a JFET used as WBGT 560a. As long as a gate-to-source voltage $V_{GS}$ is sufficiently high to not pinch-off the conduction channel, the JFET conducts a drain current $I_D$. Typically, the pinch-off gate-to-source voltage $V_{GS}$ of an n-channel JFET is in a range from −15 V to −10 V, e.g. approximately −10 V and for $V_{GS}$>−9 V the forward biased JFET starts to conduct at a drain-to-source voltage $V_{DS}$ greater or equal to 0 V.

Figure 2B:
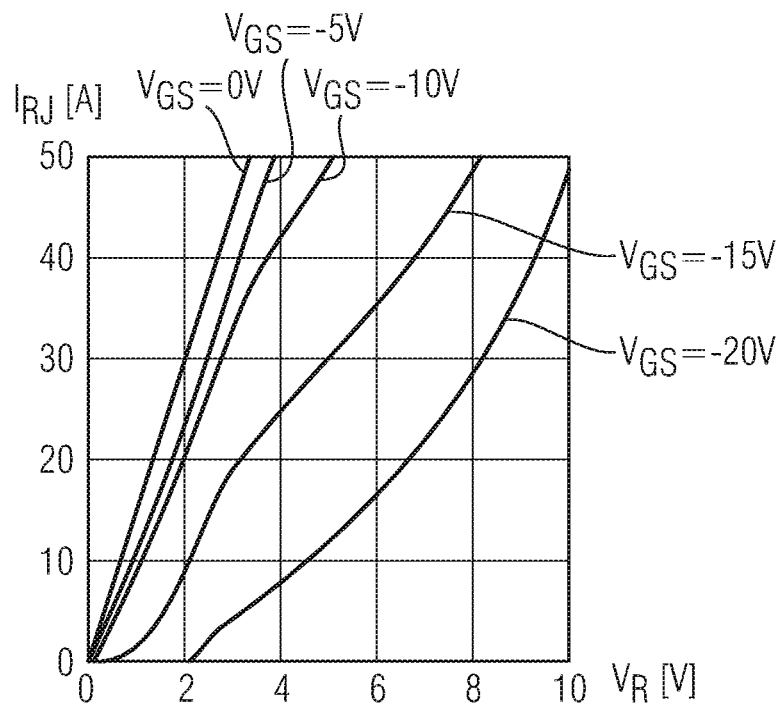
FIG. 2B is a schematic diagram showing reverse I/V characteristics of a normally-on JFET at different gate voltages to discuss effects of the embodiments.

FIG. 2B shows the reverse I/V characteristics of a JFET used as WBGT 560a at different gate-to-source voltages $V_{GS}$. If, under reverse bias, a first control signal for controlling the RC-IGBT 512 and a second control signal for controlling the transistor circuit 560 are derived from the same signal and if the desaturation transistor cells turn on at a gate-to-emitter voltage $V_{GE}$ of 0 V, the WBGT 560a is on during desaturation. In this case, the second ohmic I/V characteristic 415b describes the behavior of the WBGT 560a.

If the first control signal for controlling the RC-IGBT 512 and the second control signal for controlling the transistor circuit 560 are derived from the same signal and if the desaturation transistor cells turn on at a gate-to-emitter voltage $V_{GE}$ of −15 V, a JFET used as WBGT 560a is off during desaturation. In this case, the diode I/V characteristic 416 as illustrated in FIG. 1C is affected by the body diode 569 of the JFET used as WBGT 560a and describes the behavior of the WBGT 560a.

According to FIG. 2B, for sufficiently low $V_{GS}$, the reverse I/V characteristic approximates the characteristics of a pn-diode, as far as the JFET channel exists.

For small reverse currents $I_R$ the body diode 569 of the transistor circuit 560 takes most of the current, since the body diode 569 shows a few set-in voltage and conducts even at low reverse voltage $V_R$ at which the desaturated RC-IGBT 512 does not conduct.

Figure 2C:
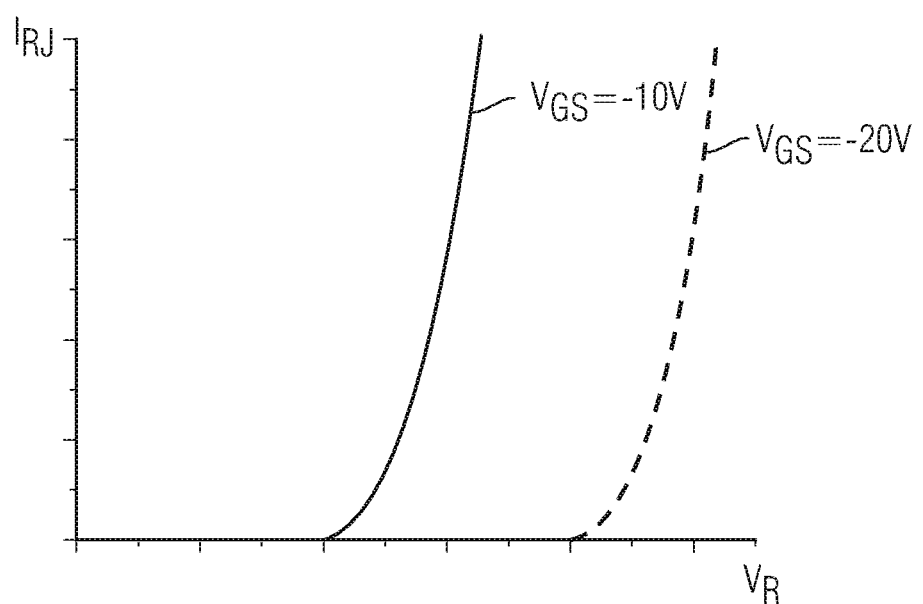
FIG. 2C is a schematic diagram showing reverse I/V characteristics of a normally-on HEMT (high electron mobility transistor) at different gate voltages to discuss effects of the embodiments.

FIG. 2C shows the reverse characteristics of a normally-on GaN-HEMT used as WBGT 560a in FIG. 1A. For a lower gate-to-source voltage, the GaN-HEMT shows a low set-in voltage such that for small reverse currents $I_R$ the GaN-HEMT takes most of the reverse current $I_R$.

FIGS. 3A to 3E refer to electric assemblies 500 based on parallel connections 580 of different bipolar switching devices 510 and WBGTs 560a.

Figure 3A:
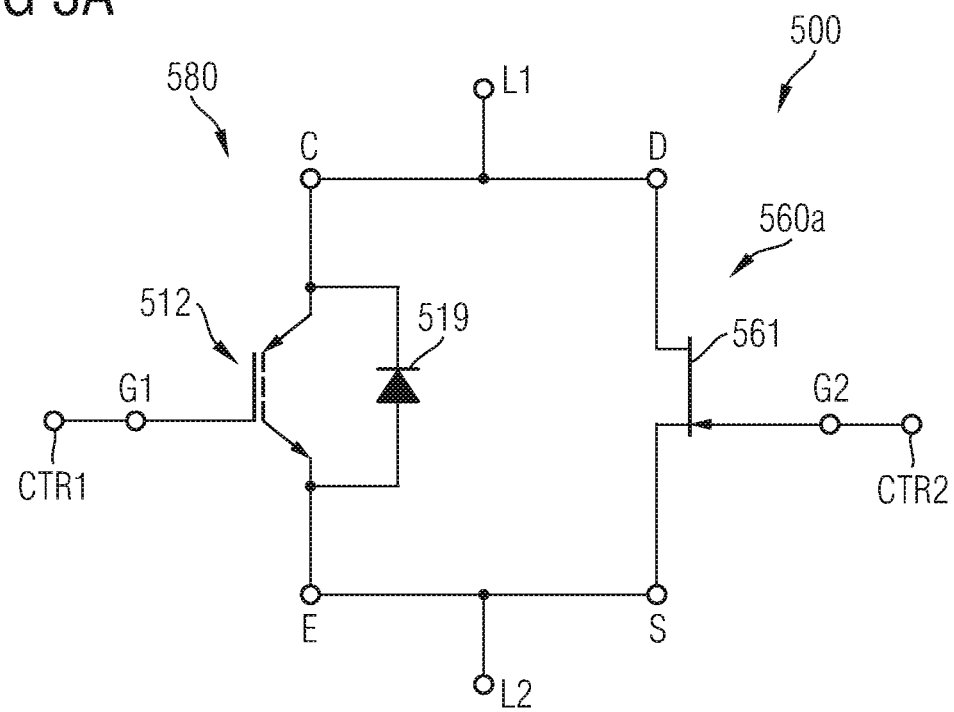
FIG. 3A is a schematic circuit diagram of an electric assembly according to an embodiment concerning a parallel connection of an RC-IGBT and a normally-on JFET without integrated body diode.

The electric assembly 500 illustrated in FIG. 3A includes an RC-IGBT 512 with integrated body diode 519, e.g., an Si-RCDC (silicon RC-IGBT with diode control). The WBGT 560a is a SiC JFET 561 electrically arranged parallel to the RC-IGBT 512. The SiC JFET 561 increases efficiency of desaturation of the reverse biased RC-IGBT 512, improves low-current conductivity of the electric assembly 500 under both forward and reverse bias, and/or attenuates the impact of snapback in the reverse-biased RC-IGBT 512 on the circuit environment.

A collector terminal C of the RC-IGBT 512 forms or is electrically connected to the first load terminal L1, an emitter terminal E forms or is electrically connected to the second load terminal L2, and a gate terminal G forms or is electrically coupled or connected to the first control terminal CTR1 of the electric assembly 500. The body diode 519 is spatially merged with transistor cells of the RC-IGBT 512. A first control signal applied to the first control terminal CTR1, turns on and off transistor cells of the RC-IGBT 512. The transistor cells include transistor cells for switching a load current under forward bias and may include desaturation transistor cells switched under reverse bias of the RC-IGBT 512.

A drain terminal D of the JFET 561 is directly electrically connected to the first load terminal L1, to the collector electrode C or to both. A source terminal S of the SiC JFET 561 is directly electrically connected to the second load terminal L2, to the emitter electrode E or to both. A gate terminal G2 of the JFET 561 may form or may be electrically connected or coupled to a second control terminal CTR2 of the electric assembly 500. A second control signal applied to the second control terminal CTR2 temporally pinches off conduction channels in the JFET 561. A semiconductor portion of the JFET 561 may be from SiC.

Figure 3B:
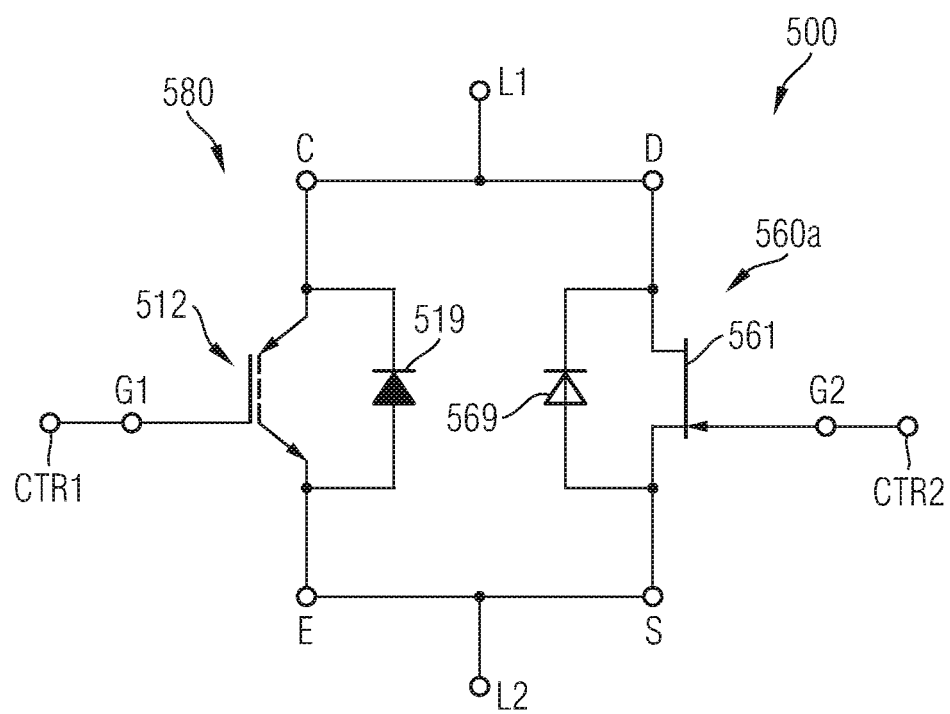
FIG. 3B is a schematic circuit diagram of an electric assembly according to an embodiment concerning a parallel connection of an RC-IGBT and a normally-on JFET with integrated body diode.

In FIG. 3B the electric assembly 500 includes a JFET 561 with integrated body diode 569, wherein the integrated body diode 569 is electrically arranged anti-parallel to the RC-IGBT 512 and parallel to the body diode 519 of the RC-IGBT 512. A semiconductor portion of the JFET 561 is from a wide bandgap material, e.g., from SiC.

Figure 3C:
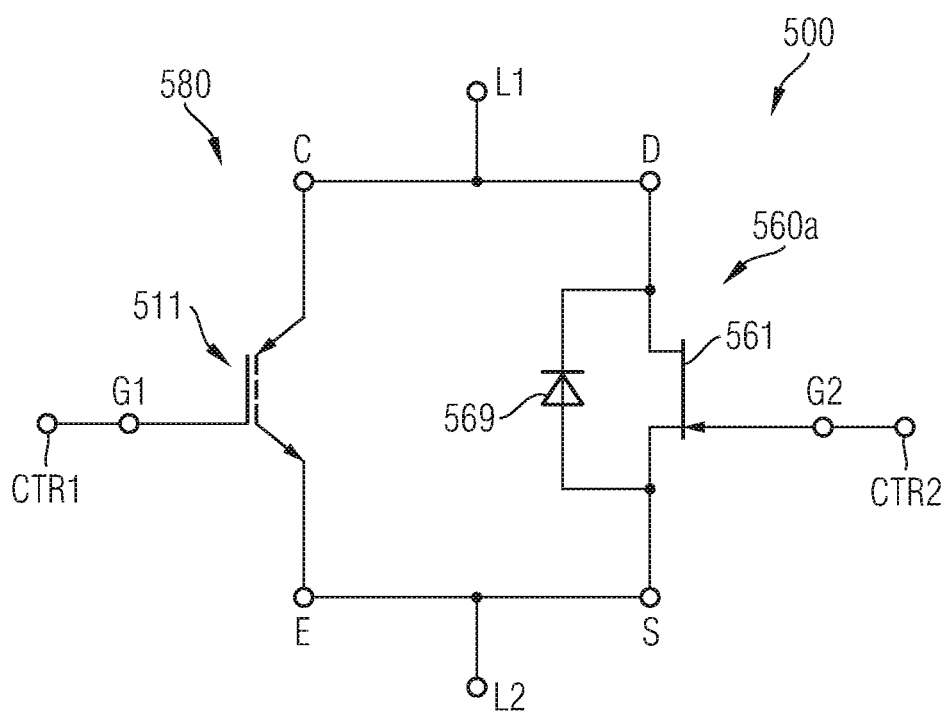
FIG. 3C is a schematic circuit diagram of an electric assembly according to an embodiment concerning a parallel connection of a reverse blocking IGBT and a normally-on JFET with integrated body diode.

The electric assembly 500 of FIG. 3C includes a JFET 561 with integrated body diode 569, wherein the integrated body diode 569 is electrically arranged anti-parallel to a reverse blocking IGBT 511. A semiconductor portion of the JFET 561 may be from SiC.

Figure 3D:
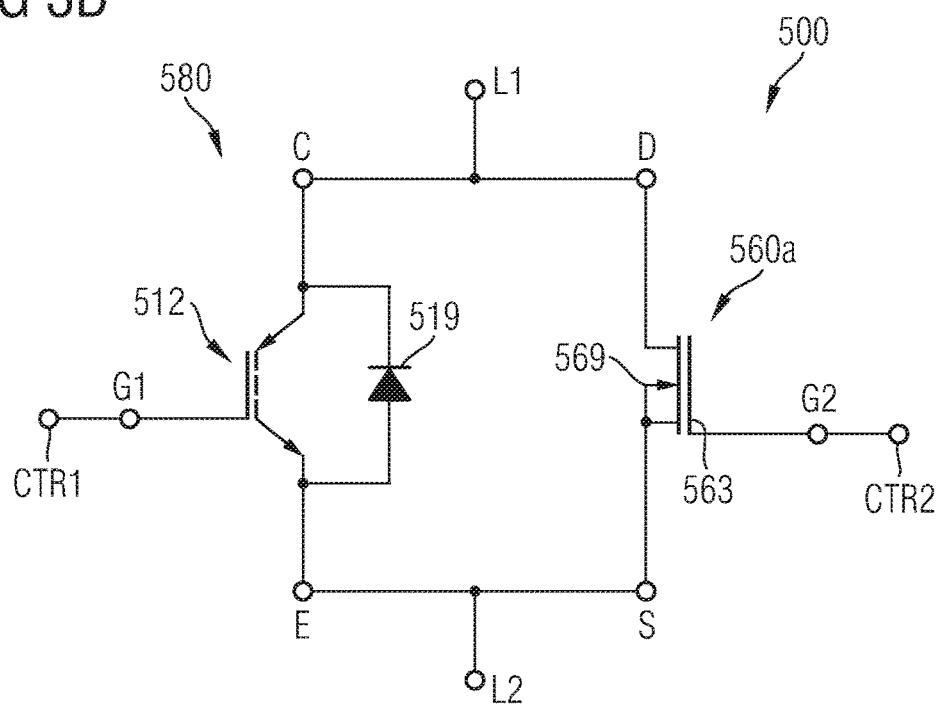
FIG. 3D is a schematic circuit diagram of an electric assembly according to an embodiment concerning a parallel connection of a reverse blocking IGBT and a normally-on SiC MOSFET with integrated body diode.

In FIG. 3D the WBGT 560a is a depletion-type SiC-MOSFET 563 including an intrinsic body diode 569. The body diode 569 of the SiC-MOSFET 563 can be used in a similar way as the body diode of the JFET 561.

Figure 3E:
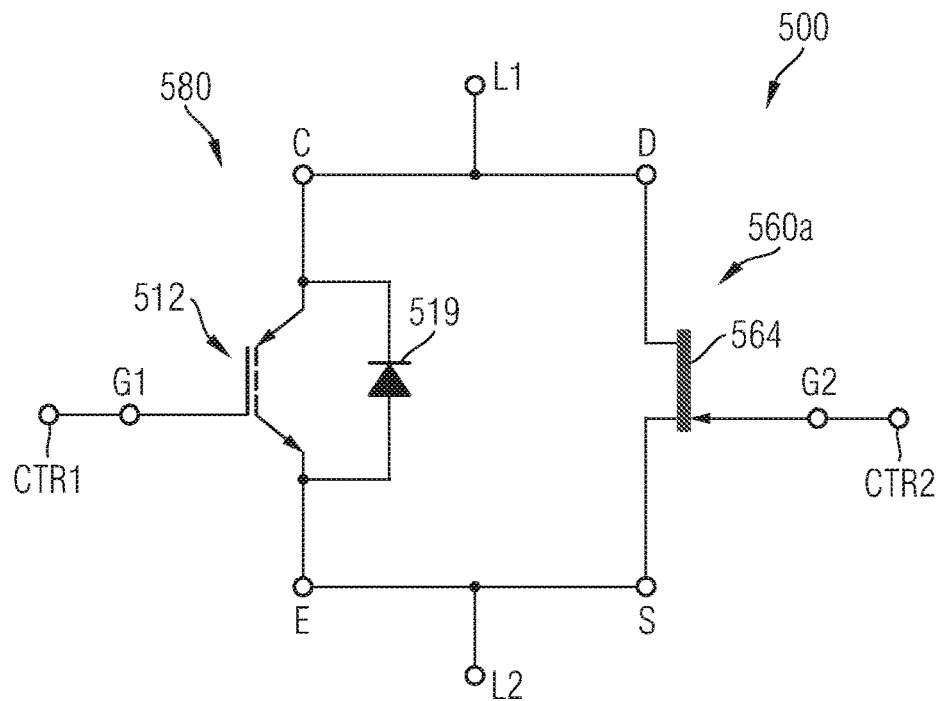
FIG. 3E is a schematic circuit diagram of an electric assembly according to an embodiment concerning a parallel connection of a reverse blocking IGBT and a normally-on GaN HEMT.

FIG. 3E refers to an GaN-HEMT 564 used as WBGT 560a. The reverse characteristics of a GaN-HEMT as described with reference to FIG. 2C improve the desaturation efficiency of the RC-IGBT 512 as described above.

Figure 4B:
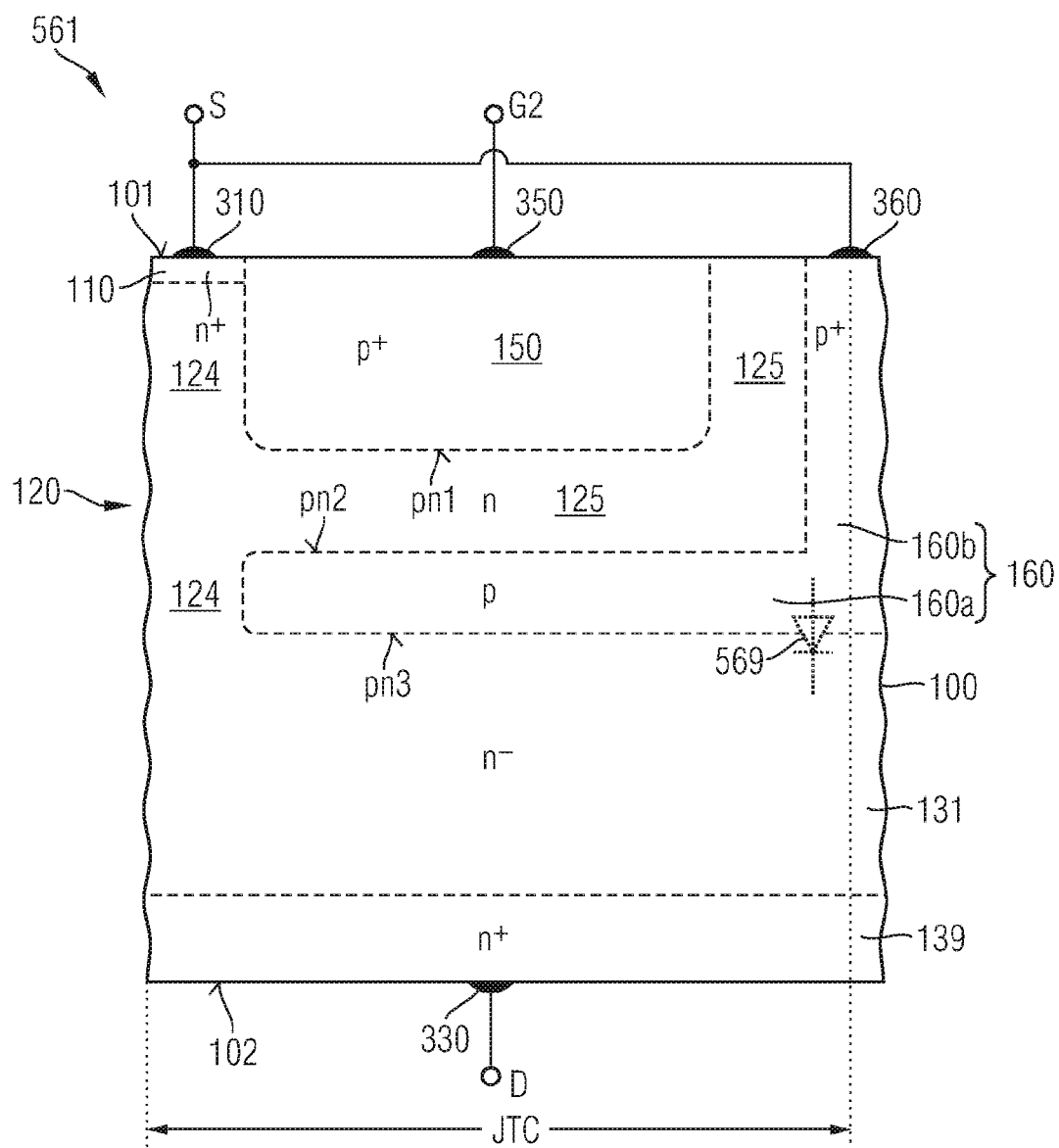
FIG. 4B is a schematic vertical cross-sectional view of a portion of an SiC JFET including a vertical channel region and a shielding region effective as anode region of an integrated body diode according to another embodiment.

FIGS. 4A and 4B refer to a SiC JFET 561 with integrated body diode 569. The SiC JFET 561 includes a semiconductor portion 100 which is based on silicon carbide SiC, for example 6H—SiC (SiC of the 6H poly type), 15R—SiC, 4H—SiC or 3C—SiC, by way of example. The semiconductor portion 100 has a first surface 101, which may be planar or which may include surface sections in parallel planes, and a planar second surface 102 parallel to the first surface 101 or the surface sections. A normal to the first surface 101 or the parallel surface sections defines a vertical direction and directions orthogonal to the vertical direction are lateral directions.

In the semiconductor portion 100 a heavily doped source region 110 may directly adjoin the first surface 101. A source electrode 310 electrically connected to a source terminal S of the SiC JFET 561 may directly adjoin the source region 110.

A drain structure 130 having the same conductivity type as the source region 110 may be formed in the semiconductor portion 100 on a side opposite to the first surface 101. The drain structure 130 may directly adjoin the second surface 102. A drain electrode 330 electrically connected to a drain terminal D of the SiC JFET 561 may directly adjoin the drain structure 130.

The drain structure 130 includes a lightly doped drift layer 131 forming a unipolar homojunction a heavily doped contact portion 139 that directly adjoins the second surface 102 and that forms an ohmic contact with the drain electrode 330.

A channel region 120 connects the source region 110 and the drain structure 130. The channel region 120 has the same conductivity type as the source region 110 and the drain structure 130, wherein a mean net dopant concentration in the channel region 120 is at most 10% of the mean net dopant concentration in the source region 110.

A heavily doped gate region 150 may extend from the first surface 101 into the semiconductor portion 100. The gate region 150 has a conductivity type opposite to that of the channel region 120. The channel and gate regions 120, 150 form first pn junctions pn1 that extend along the vertical direction and/or along the lateral direction. A gate electrode 350 electrically connected or coupled to a gate terminal G2 of the SiC JFET 561 may directly adjoin the gate region 150.

A voltage applied to the gate region 150 modulates the lateral extension of a depletion zone formed along a vertical portion of the first pn junction pn1 between the gate and channel regions 150, 120 and/or the vertical extension of a depletion zone formed along a horizontal portion of the first pn junction pn1. At a certain gate voltage, the depletion zone extends across the complete lateral cross-sectional area of the channel region 120 thereby suppressing and pinching off a current flow between the source regions 110 and the drain structure 130. The SiC JFET 561 is a normally-on type JFET with a current flow between the source regions 110 and the drain structure 130 when no voltage is applied between the gate terminal G2 and the source terminal S.

A shielding region 160 with the conductivity type of the gate region 150 is formed at least in a portion of the vertical projection of the gate region 150 between the gate region 150 and the drain structure 130. The shielding region 160 forms a second pn junction pn2 with the channel region 120 and a third pn junction pn3 with the drain structure 130 and may include a lateral portion 160a extending parallel to the second surface 102. A vertical projection of the lateral portion 160a of the shielding region 160 may overlap with at least 40% of the gate region 150.

The shielding region 160 may or may not include a vertical portion 160b directly adjoining the lateral portion 160a and the first surface 101. A shielding electrode 360 may directly adjoin the shielding region 160. The shielding electrode 360 may be electrically connected or coupled to the source electrode 310, the gate electrode 350, or to an anode terminal A of the SiC JFET 561.

In FIG. 4A, the channel region 120 includes a first vertical portion 121 sandwiched between the gate region 150 and the vertical portion 160b of the shielding region 160, a horizontal portion 122 sandwiched between the gate region 150 and the lateral portion 160a of the shielding region 160 and a second vertical portion 123 extending between neighboring lateral portions 160a of shielding regions 160 assigned to neighboring junction transistor cells JTC.

In FIG. 4B, the channel region 120 includes a vertical channel portion 124 extending between the gate regions 150 and between the lateral portions 160a of shielding regions 160 of neighboring junction transistor cells JTC as well as an auxiliary portion 125 that directly adjoins to the vertical channel portion 124 and that separates the shielding region 160 from the gate region 150.

The SiC JFETs 561 of FIGS. 4A and 4B may include a plurality of the channel, gate, source, and shielding regions 120, 150, 110, 160 that form a plurality of identical junction transistor cells JTC.

The third pn junctions pn3 between the shielding regions 160 and the drain structure 130 provide a well-defined and reliable integrated body diode 569 which may be effective between the source terminal S and the drain terminals D, e.g. if the shielding electrode 360 is directly electrically connected to the source electrode 310, or, if the shielding electrode 360 is electrically connected to an anode terminal A, which is electrically connected to the source terminal S through a low-ohmic connection outside of the JFET 561.

Figure 5:
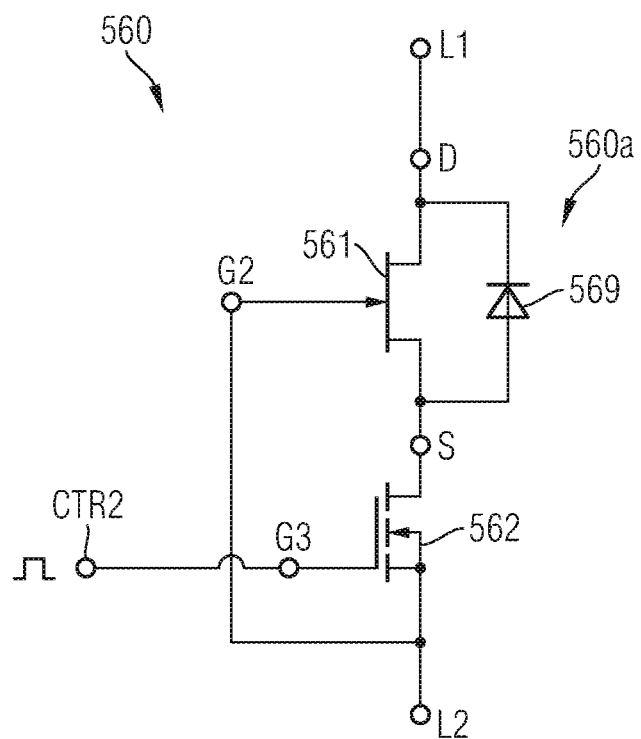
FIG. 5 is a schematic circuit diagram of a transistor circuit including a cascode configuration of an IGFET and a normally-on WBGT according to an embodiment.

In FIG. 5 the transistor circuit 560 includes an IGFET (insulated gate field effect transistor), for example an MOS-FET (metal-oxide-semiconductor FET) in the usual meaning including IGFETs with gate electrodes from metal and IGFETs with gate electrodes from heavily doped semiconductor material. A load path of the IGFET 562 is electrically connected in series with the load path of the normally-on WBGT 560a between the source terminal of the WBGT 560a and the second load terminal L2. The gate terminal G2 of the WBGT 560a may be directly connected to the second load terminal L2. A gate terminal G3 of the IGFET 562 is electrically coupled or connected to the second control terminal CTR2. The IGFET 562 is of the enhancement type such that the transistor circuit 560 is off as long as a control signal applied to the second control terminal CTR2 is below a positive threshold voltage of the IGFET 562.

A positive control signal at the second control terminal CTR2 turns on the IGFET 562 such that the source terminal S of the JFET 561 adopts the potential of the second load terminal L2. With the second gate terminal G2 and the source terminal S of the normally-on WBGT 560a at the same potential, the WBGT 560a turns on. If the IGFET 562 is off, the potential at the source terminal may rise such that the voltage drop between the gate terminal G2 and the source terminal S may be sufficient to turn off the WBGT 560a.

Figure 6A:
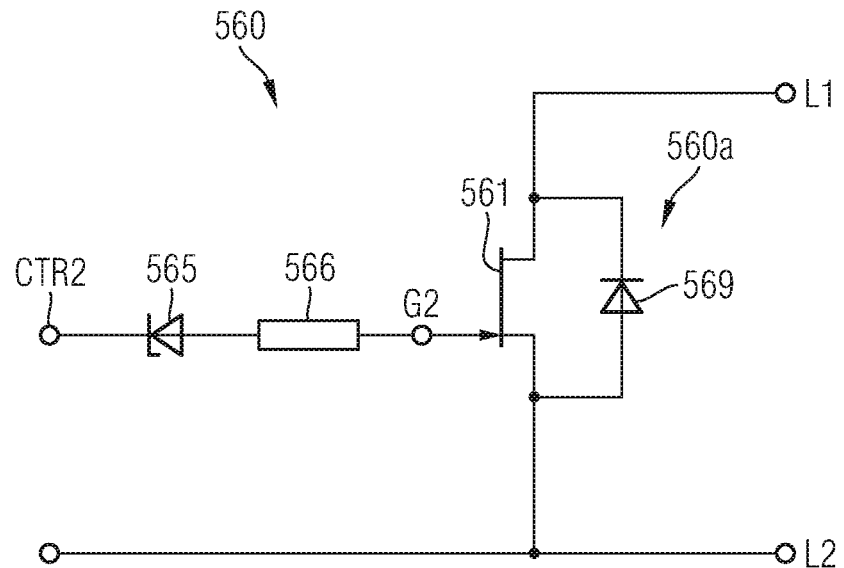
FIG. 6A is a schematic circuit diagram of a transistor circuit including a voltage limiting device in the control path according to an embodiment based on a series connection of the voltage limiting device.
Figure 6B:
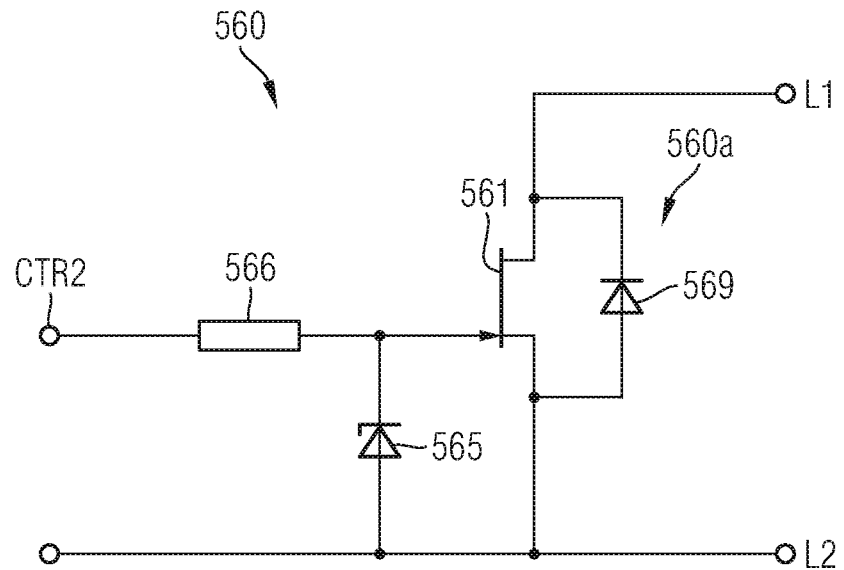
FIG. 6B is a schematic circuit diagram of a transistor circuit including a voltage limiting device in the control path according to an embodiment based on a parallel connection of the voltage limiting device.

FIGS. 6A and 6B refer to transistor circuits 560 including a voltage limiting device 565 for clamping the voltage of the second control signal applied to the gate terminal G2 of the WBGT 560a such that the voltage across the first pn junction pn1 between the gate region 150 and the channel region 120 of FIGS. 4A and 4B does not exceed a nominal maximum gate voltage of, e.g., 2V.

In FIG. 6A the voltage limiting device 565 is a voltage limiting diode, for example, a suppressor diode such as a Zener diode that may reduce a 15V level of a control signal applied to the second control terminal CTR2 by, e.g., 13V. A gate resistance 566 may be electrically connected in series between the anode of the voltage limiting diode 565 and the gate terminal G2 of the WBGT 560a.

In FIG. 6B the voltage limiting device 565 is a voltage limiting diode, e.g., a Zener diode, electrically connected in parallel to the gate-source path of the WBGT 560a. A gate resistance 566 may be electrically connected in series between the cathode of the voltage limiting diode 565 and the second control terminal CTR2 to reduce the load effective for a gate driver.

Figure 7A:
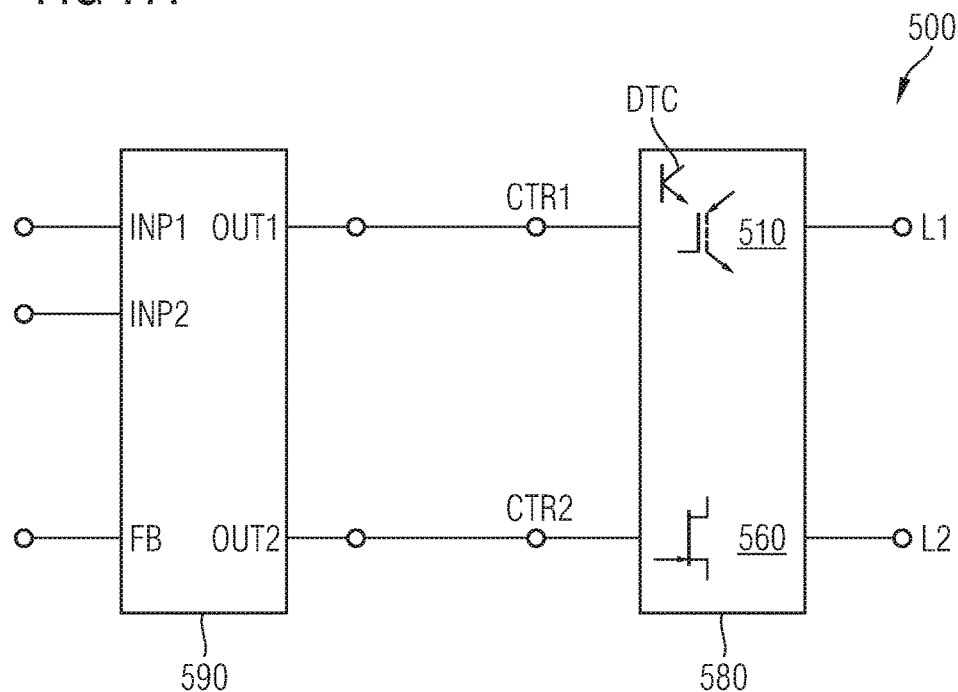
FIG. 7A is a schematic circuit diagram of an electric assembly including a control circuit according to an embodiment concerning separated control of an IGBT and a normally-on JFET.
Figure 7B:
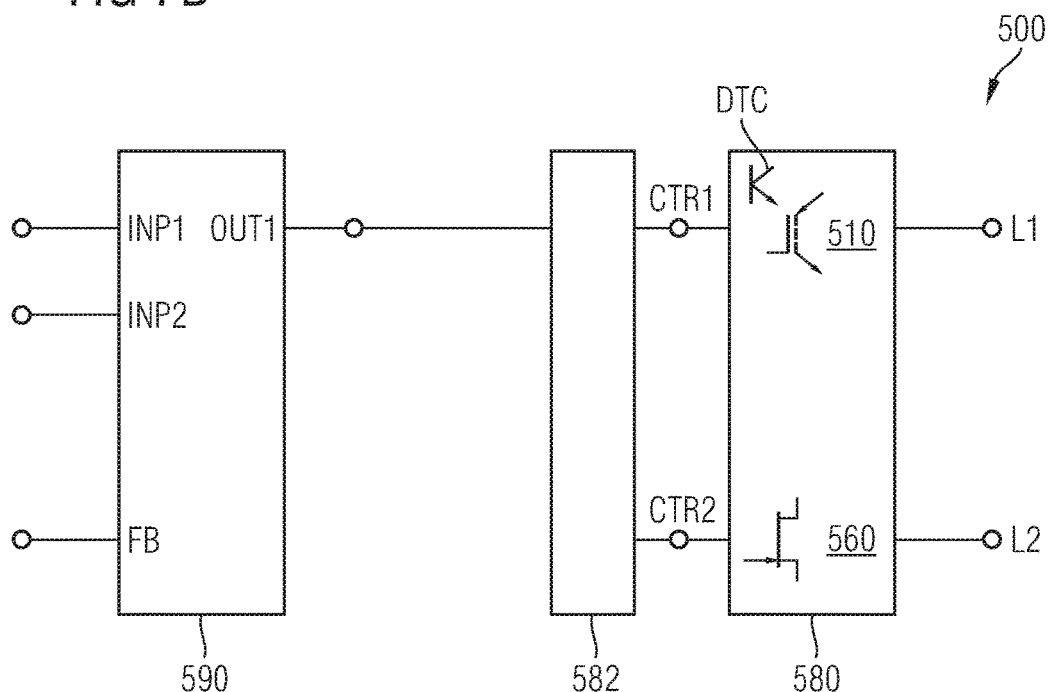
FIG. 7B is a schematic circuit diagram of an electric assembly including a control circuit according to an embodiment concerning common control of an IGBT and a normally-on JFET.

FIGS. 7A and 7B refer to an electric assembly 500 including a parallel connection 580 of a bipolar switching device 510 and an transistor circuit 560, wherein type, layout, dimensions, dopant concentrations and dopant gradients of an WBGT 560a of the transistor circuit 560 are selected such that the IN characteristics fulfill at least one of the conditions as outlined above.

In FIG. 7A, a first control output OUT1 of the control circuit 590 is electrically connected to the first control input CTR1 of the bipolar switching device 510. A second control output OUT2 of the control circuit 590 is electrically coupled, e.g. electrically connected to the second control input CTR2 of the transistor circuit 560. The parallel connection 580 may be or may be part of the low-side switch or of the high-side switch in a half-bridge circuit. The control circuit 590 may include further control outputs for controlling a further electric assembly that forms or that is part of the complementary switch in the half-bridge circuit.

The control circuit 590 generates and outputs control signals, e.g., square signals at the first and second control outputs OUT1, OUT2, wherein the level of the control signals control the on and off periods of transistor cells of the bipolar switching device 510 under forward bias, and if the bipolar switching device 510 is an RC-IGBT also under reverse bias. For example, a high level of the control signal close to VCC, e.g. +15 V, may turn on the bipolar switching device 510 and a low level of the control signal close to, e.g. VEE, e.g. −15 V, may turn off the bipolar switching device 510 under forward bias. The transistor circuit 560 may be turned on and off synchronously with the bipolar switching device 510 under forward bias.

In addition, the control circuit 590 may generate and output a desaturation pulse of predefined duration at the first control output OUT1 at the end of a reverse bias in case the bipolar switching device 510 is an RC-IGBT. The desaturation pulse is applied to the first control input CTR1 of the electric assembly 500 at a predefined point in time before a bias across the electric assembly 500 changes from reverse to forward. The desaturation pulse turns on gated channels for desaturation, e.g., desaturation transistor cells provided only for desaturation or some or all of transistor cells that control the load current under forward bias.

The length of a desaturation pulse may depend on the switching frequency at which the control circuit 590 turns on and off the RC-IGBT 512. A safety period between the end of the desaturation pulse and the predicted start of commutation including the change from reverse bias to forward bias may be in a range from several hundred nanoseconds to several microseconds.

Under reverse bias, a control signal output at the second output terminal OUT2 may control the transistor circuit 560 such that during saturation the transistor circuit 560 is on and takes the greater portion of the reverse current under low load conditions or open circuit conditions such that power conversion efficiency under low load conditions is improved and power consumption of a stand-by mode is reduced. During desaturation the transistor circuit 560 may be controlled such that the conduction channels are not pinched-off or, alternatively, that the conduction channels are pinched off and a body diode of the transistor circuit 560 is active.

The control circuit 590 may include further input terminals INP1, INP2, . . . that allow a higher control instance, e.g., a processor circuit to control the control circuit 590. One or more feedback terminals FB may receive a signal or signals descriptive for load and/or source conditions such that the control circuit 590 may adjust duty cycle and/or switching frequency of the electric assembly 500 to varying load or source conditions.

In FIG. 7B the electric assembly 500 includes a conversion network 582 that derives the second control signal applied to the second control terminal CTR2 from the first control signal applied to the first control terminal CTR1. The control circuit 590 includes only one output OUT1 per electric assembly, and may include two outputs for controlling two electric assemblies 500 of a complete half bridge.

Figure 8:
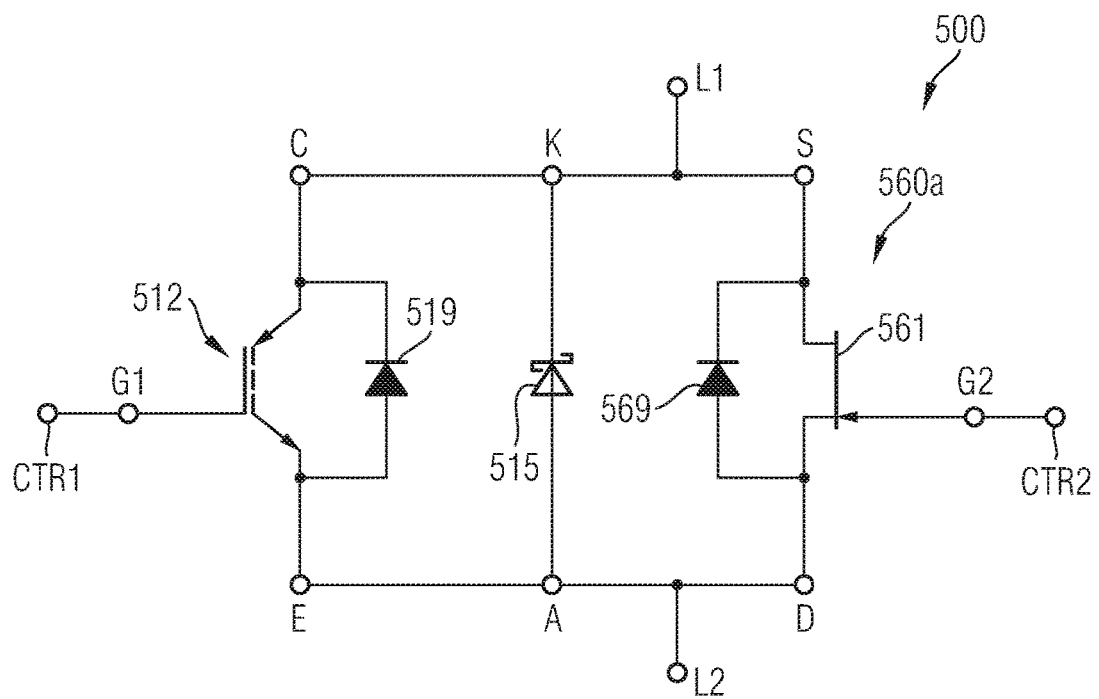
FIG. 8 is a schematic circuit diagram of an electric assembly according to an embodiment including a silicon RC-IGBT, an SiC JFET, and an SiC clamping diode.

In FIG. 8, the electric assembly 500 includes a clamping diode 515 with a breakdown voltage lower than a breakdown voltage of a SiC JFET 561 and lower than a breakdown voltage of the RC-IGBT 512. An overvoltage condition triggers an avalanche breakdown only in the clamping diode 515 such that the clamping diode 515 may protect the RC-IGBT 512 and the JFET 561 against overvoltage. The clamping diode 515 may be designed for high avalanche ruggedness such that design constraints for the JFET 561 are relaxed in this respect. The clamping diode 515 may be a SiC MPS (merged pin Schottky) diode, wherein the avalanche breakdown in the clamping diode 515 generates electron/hole pairs such that the reverse current is high and the clamping diode 515 effectively protects the RC-IGBT 512 against overvoltage.

The electric assemblies 500 illustrated in FIGS. 9A and 9B include a carrier board 599, e.g., a PCB (printed circuit board) or DCB (directly copper bonding) board. At least a first conductor structure 591 and a second conductor structure 592 are formed on a mounting surface of the carrier board 599. The first conductor structure 591 forms or is electrically connected to a first load terminal L1. The second conductor structure 592 forms or is electrically connected to a second load terminal L2. The first and second conductor structures 591, 592 may be copper pads or copper strips.

A silicon RC-IGBT 512, a clamping diode 515 and a WBGT 560a are mounted, e.g., soldered or bonded side-by-side on the first conductor structure 591, wherein the cathode of the clamping diode 515, the collector of the silicon RC-IGBT 512, and the drain of the WBGT 560a directly contact the first conductor structure 591. Bond wirings 586 electrically connect the exposed anode terminal A of the clamping diode 515 and the exposed source terminal S of the WBGT 560a with the second conductor structure 592.

In FIG. 9A the inductance of the bond wiring 586 between the WBGT 560a and the second conductor structure 592 may be increased by reducing the number of bond wires in the bond wiring 586 between the WBGT 560a and the second conductor structure 592, by lengthening the bond wires or by selecting material with higher ohmic resistivity, for increasing the line resistance. The increased stray inductance may further delay the recovery of the charge carrier plasma after desaturation.

In FIG. 9B a loop 587 in the second conductor structure 592 between the silicon RC-IGBT 512 and the WBGT 560*a* may increase a stray impedance between the silicon RC-IGBT 512 and the WBGT 560*a*.

FIG. 10 refers to a portion of an electronic assembly 600 that may be a motor drive, a switched mode power supply, a primary stage of a switched mode power supply, a synchronous rectifier, a primary stage of a DC/AC converter, a secondary stage of a DC/AC converter, a primary stage of a DC/DC converter, or a portion of a solar power converter, by way of example.

The electronic assembly 600 may include two identical electric assemblies 500 as described above arranged as low-side switch and high-side switch in a half-bridge configuration. The electric assemblies 500 may include silicon RC-IGBTs 512 with body diodes 519 and SiC JFETs 561 effective as described above. The load paths of the two electric assemblies 500 are electrically connected in series between a first supply terminal A and a second supply terminal B. The supply terminals A, B may supply a DC (direct-current) voltage or an AC (alternating-current) voltage. An intermediate network node NN between the two electric assemblies 500 may be electrically connected to an inductive load LD, which may be a winding of a transformer or a motor winding, or to a reference potential of an electronic circuit, by way of example.

The electronic assembly 600 may be a motor drive with the electric assemblies 500 electrically arranged in a half-bridge configuration, the network node NN electrically connected to a motor winding and the supply terminals A, B supplying a DC voltage.

According to another embodiment, the electronic assembly 600 may be a primary side stage of a switched mode power supply with the supply terminals A, B supplying an AC voltage of an input frequency to the electronic assembly 600. The network node NN is electrically connected to a primary winding of a transformer.

The electronic assembly 600 may be a synchronous rectifier of a switched mode power supply with the supply terminals A, B connected to a secondary winding of the transformer and the network node NN electrically connected to a reference potential of an electronic circuit at the secondary side of the switched mode power supply.

According to a further embodiment, the electronic assembly 600 may be a primary side stage of a DC/DC converter, e.g., a power optimizer or a micro-inverter for applications including photovoltaic cells with the supply terminals A, B supplying a DC voltage to the electronic assembly 600 and the network node NN electrically connected to an inductive storage element.

According to another embodiment, the electronic assembly 600 may be a secondary side stage of a DC/DC converter, e.g., a power optimizer or a micro-inverter for applications including photovoltaic cells, wherein the electronic assembly 600 supplies an output voltage to the supply terminals A, B and wherein the network node NN is electrically connected to the inductive storage element.

Figure 11:
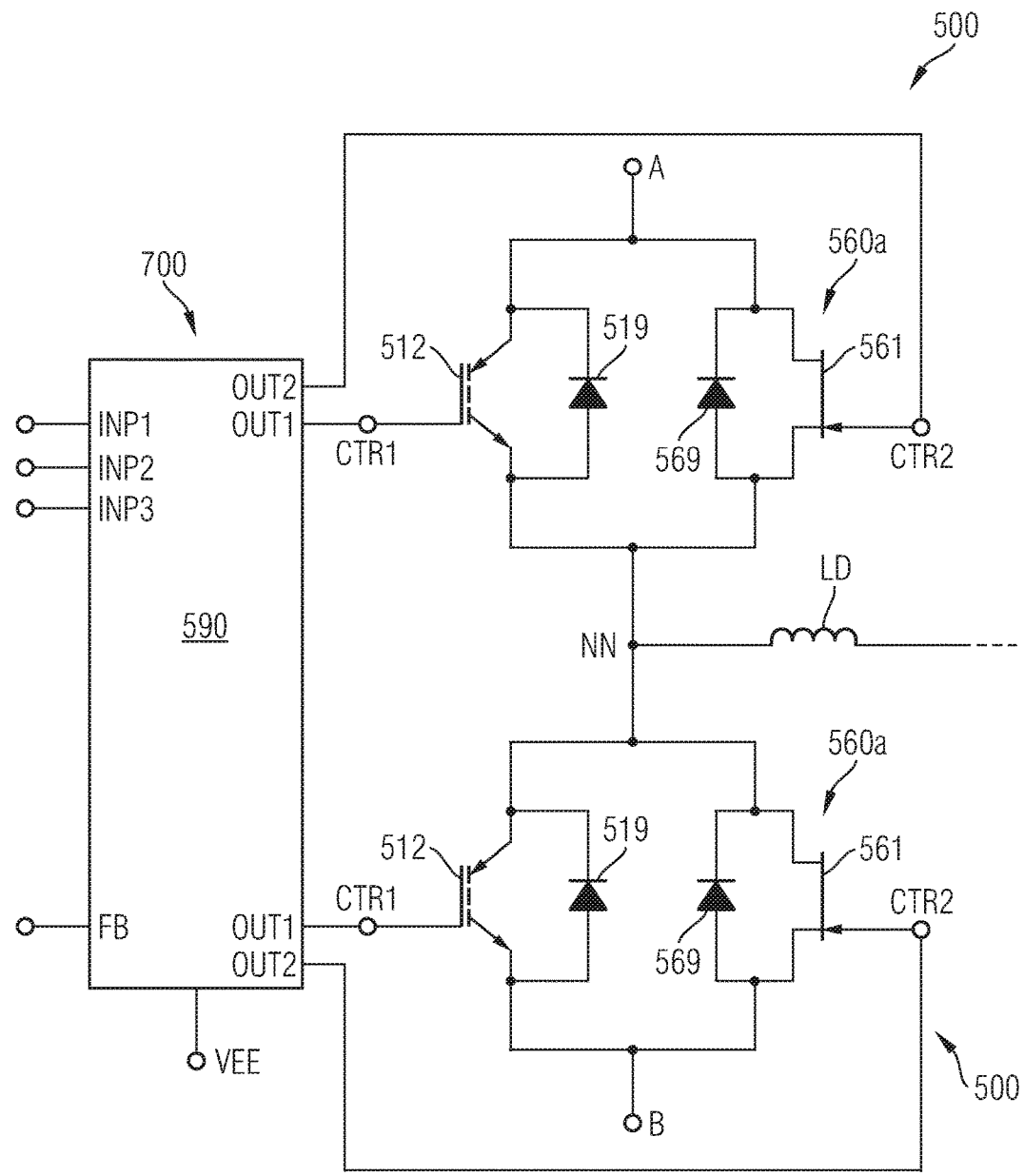
FIG. 11 is a schematic diagram of a smart IGBT module including SiC JFETs electrically connected parallel to silicon RC-IGBTs according to a further embodiment.

FIG. 11 refers to a power module, e.g. an integrated power module such as an IGBT module 700 including the electronic assembly 600 of FIG. 10. The IGBT module 700 may further include a control circuit 590 configured to supply control signals for alternately switching on and off the electric assemblies 500 and electrically connected to control terminals CTR1, CTR2 of the electric assemblies 500.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electric assembly, comprising:
a bipolar switching device; and,
a transistor circuit electrically connected in parallel with the bipolar switching device and comprising a normally-on wide bandgap transistor, wherein a semiconductor portion of the wide bandgap transistor comprises an integrated body diode, wherein an anode region of the body diode is electrically connected to a source terminal of the wide bandgap transistor and a drain structure of the wide bandgap transistor is effective as a cathode region of the body diode, wherein the wide bandgap transistor comprises a gate region forming a first pn junction with a channel region that connects the drain structure with a source region separated from the drain structure by the channel region, and wherein a shielding region sandwiched between the channel region and the drain structure forms a second pn junction with the channel region and a third pn junction with the drain structure.

2. The electric assembly of claim 1, wherein the normally-on wide bandgap transistor is a high electron mobility transistor.

3. The electric assembly of claim 1, wherein the normally-on wide bandgap transistor is a normally-on junction field effect transistor.

4. The electric assembly of claim 3, wherein a semiconductor portion of the junction field effect transistor is from silicon carbide.

5. An electric assembly, comprising:
a bipolar switching device; and
a transistor circuit electrically connected in parallel with the bipolar switching device and comprising a normally-on wide bandgap transistor,
wherein the normally-on wide bandgap transistor is a normally-on junction field effect transistor,
wherein a semiconductor portion of the junction field effect transistor is from silicon carbide,
wherein the semiconductor portion comprises junction transistor cells and an integrated body diode, an anode region of the body diode is electrically connected to a source terminal of the junction field effect transistor, and a drain structure of the junction transistor cells is effective as a cathode region of the body diode,
and wherein the junction transistor cells comprise gate regions forming first pn junctions with channel regions that connect the drain structure with source regions separated from the drain structure by the channel regions, and shielding regions sandwiched between the channel regions and the drain structure and forming second pn junctions with the channel regions and third pn junctions with the drain structure.

6. The electric assembly of claim 5, wherein the shielding regions form the anode region of the body diode.

7. The electric assembly of claim 5, wherein the shielding regions are directly connected to a metal shielding electrode.

8. The electric assembly of claim 7, wherein the shielding electrode is electrically connected to a source terminal of the junction field effect transistor.

9. The electric assembly of claim 7, wherein
the shielding electrode is electrically connected to an anode terminal of the junction field effect transistor.

10. The electric assembly of claim 3, wherein
a saturation current of the junction field effect transistor is lower than a saturation current of the bipolar switching device.

11. The electric assembly of claim 3, wherein
a saturation current of the junction field effect transistor is higher than four times a nominal diode forward current of the bipolar switching device.

12. The electric assembly of claim 3, wherein
for a reverse voltage across the electric assembly starting from 0 V the junction field effect transistor is conductive.

13. The electric assembly of claim 1, wherein
the bipolar switching device comprises a reverse conducting IGBT that comprises desaturation transistor cells, wherein, under reverse bias, the desaturation transistor cells are controllable to be on during a desaturation period and to be off during a saturation period.

14. The electric assembly of claim 1, wherein
the transistor circuit comprises an insulated gate field effect transistor electrically connected in series with the wide bandgap transistor.

15. The electric assembly of claim 1, wherein
for forward voltages across the electric assembly lower than a snapback hold voltage of the bipolar switching device, a drain current through the transistor circuit is higher than a collector current through the bipolar switching device.

16. The electric assembly of claim 1, wherein
for reverse voltages across the electric assembly lower than half a snapback hold voltage of the bipolar switching device, a reverse current through the transistor circuit is higher than a reverse current through the bipolar switching device.

17. An electric assembly, comprising:
a bipolar switching device;
a transistor circuit electrically connected in parallel with the bipolar switching device and comprising a normally-on wide bandgap transistor; and
a voltage limiting device electrically connected between a control terminal of the transistor circuit and a gate terminal of the wide bandgap transistor, wherein the voltage limiting device is adapted to limit a voltage at the gate terminal of the wide bandgap transistor to at most 2 V.

18. The electric assembly of claim 1, further comprising
a control circuit electrically connected to a control terminal of the bipolar switching device and to a control terminal of the transistor circuit.

19. The electric assembly of claim 18, wherein
the control circuit comprises an output terminal electrically coupled to the control terminal of the bipolar switching device and to the control terminal of the transistor circuit.

20. The electric assembly of claim 18, wherein
the control circuit is adapted to generate a desaturation signal and to output the desaturation signal at the output terminal at a point in time preceding a change of a voltage bias across load terminals of the electric assembly from reverse to forward.

21. The electric assembly of claim 18, wherein
the control circuit comprises a first output terminal electrically coupled to the control terminal of the bipolar switching device and a second output terminal electrically coupled to the control terminal of the transistor circuit.

22. The electric assembly of claim 18, wherein
the control circuit comprises an input terminal and is adapted to turn-off the bipolar switching device in response to a signal applied to the input terminal and indicating a short circuit condition.

* * * * *